United States Patent
Ely

(10) Patent No.: US 6,738,245 B2
(45) Date of Patent: May 18, 2004

(54) SERIES-PASS OVER-VOLTAGE PROTECTION CIRCUIT HAVING MULTIPLE TRANSISTORS IN PARALLEL

(75) Inventor: Jeffrey A. Ely, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 169 days.

(21) Appl. No.: 10/159,993

(22) Filed: May 31, 2002

(65) Prior Publication Data

US 2003/0223168 A1 Dec. 4, 2003

(51) Int. Cl.[7] ................................................ H02H 3/20
(52) U.S. Cl. ...................... 361/91.1; 361/93.1; 361/93.9
(58) Field of Search .............................. 361/91.1, 91.5, 361/58, 93.9, 93.1; 307/10, 10.7

(56) References Cited

U.S. PATENT DOCUMENTS 6,185,082 B1 * 2/2001 Yang ........................... 361/90

* cited by examiner

Primary Examiner—Ronald W. Leja
Assistant Examiner—James Demakis
(74) Attorney, Agent, or Firm—Jimmy L. Funke; Stefan V. Chmielewski

(57) ABSTRACT

An improved series-pass over-voltage protection circuit including multiple parallel-connected series-pass over-voltage suppression transistors coupling a DC voltage supply such as a motor vehicle storage battery to one or more high current electrical loads. During normal operation, all of the transistors are biased to the fully conductive/enhanced state to provide very low pass-through on-resistance. However, during linear (over-voltage suppression) operation, a logic circuit enables individual transistors in sequence at a frequency that is high relative to the thermal time constant of the transistors, and with a small amount of conduction overlap between successively enabled transistors. Sequentially enabling the transistors guarantees at least a minimum level of load sharing, and the overlap minimizes switching-related output current transients.

10 Claims, 3 Drawing Sheets

SERIES-PASS OVER-VOLTAGE PROTECTION CIRCUIT HAVING MULTIPLE TRANSISTORS IN PARALLEL

TECHNICAL FIELD

This invention relates to a circuit including multiple series-pass transistors connected in parallel for coupling a DC voltage supply subject to over-voltage transients to a high current electrical load, and more particularly to a control circuit for balancing power dissipation in the transistors.

BACKGROUND OF THE INVENTION

In a motor vehicle electrical system, over-voltage protection circuitry is needed to protect electrical loads from damage due to over-voltage transients that can occur during jump-starting and load-dump conditions. Although passive shunt suppression devices such as Zener diodes or MOVs can be used in light-duty applications, the transient over-voltage energy in heavy duty applications can be too high to clamp with shunt devices. In such cases, an active device such as a series-pass transistor can be used to couple the voltage supply to the loads, and the conduction of the transistor can be controlled to provide a minimum impedance coupling in normal operation and a controlled impedance coupling in the presence of over-voltage transients. Since the transistor must be capable of dissipating the over-voltage energy, two or more transistors can be connected in parallel when there is a potential for a large amount of over-voltage energy. However, it is likely that the over-voltage energy will not be evenly balanced among the parallel-connected transistors due to parameter tolerances, causing one transistor to become hotter than the others. While such imbalances tend to even out during normal low impedance operation, they can become greatly exaggerated during linear (controlled suppression) operation due to negative temperature coefficient effects. In the case of field-effect transistors (FETs), for example, the gate threshold voltage tends to decrease with increasing transistor temperature, causing the hottest FET to turn on even harder, leading to a condition commonly referred to as power-hogging. A similar effect occurs in bipolar transistors, where increases in temperature cause the base-emitter voltage threshold to decrease and the transistor gain to increase. While the imbalance may be mitigated to some extent by utilizing a negative feedback element such as a source or emitter resistor that reduces the conduction of the transistor(s) bearing an inordinate share of the power dissipation, the added resistance causes a handicap during normal low impedance operation when the on-resistance has to be minimized. Accordingly, what is needed is an improved control for parallel-connected series-pass over-voltage suppression transistors that ensures acceptable load sharing during linear (controlled suppression) operation, while retaining minimum pass-through impedance during normal operation.

SUMMARY OF THE PRESENT INVENTION

The present invention is directed to an improved series-pass over-voltage protection circuit including multiple parallel-connected series-pass over-voltage suppression transistors coupling a DC voltage supply such as a motor vehicle storage battery to one or more high current electrical loads. During normal operation, all of the transistors are biased to the fully conductive/enhanced state to provide very low pass-through on-resistance. However, during linear (over-voltage suppression) operation, individual transistors are enabled in sequence at a frequency that is high relative to the thermal time constant of the transistors, and with a small amount of conduction overlap between successively enabled transistors. Sequentially enabling the transistors guarantees at least a minimum level of load sharing, and the overlap minimizes switching-related output current transients.

BRIEF DESCRIPTION OF THE DRAWINGS

FIG. 3A depicts an over-voltage suppression circuit including a set of parallel-connected series-pass MOSFETs, while FIG. 3B depicts a control circuit for sequentially enabling the MOSFETs of FIG. 3A during linear (over-voltage suppression) operation.

DESCRIPTION OF THE PREFERRED EMBODIMENT

Figure 1:
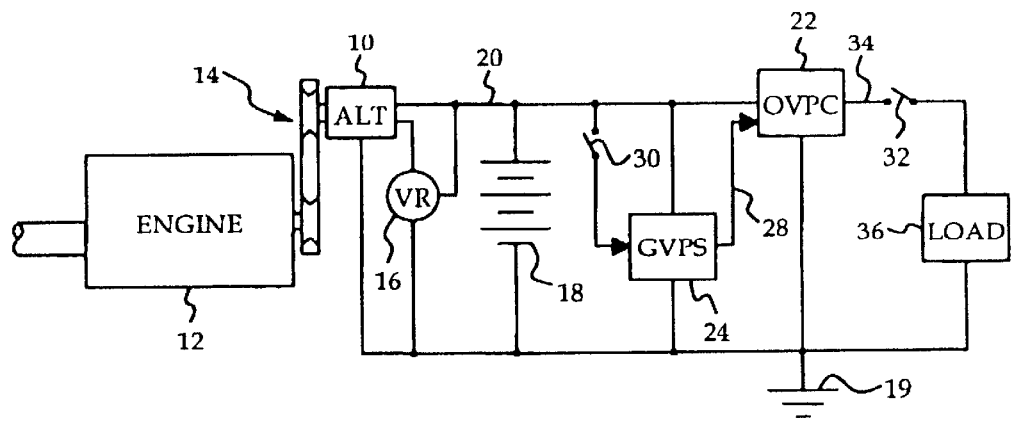
FIG. 1 is a block diagram of a motor vehicle electrical system including a series-pass over-voltage protection circuit according to this invention.

Referring to FIG. 1, the over-voltage protection circuit of the present invention is disclosed in the context of a conventional motor vehicle electrical system including a 24V storage battery 18 and one or more high current electrical loads 36 that draw operating current through a vehicle ignition switch 32. However, it will be recognized that the over-voltage protection circuit of this invention can also be used in other applications involving a DC power supply subject to over-voltage transients.

In the illustrated electrical system, an engine 12 drives an alternator (ALT) 10 via a belt and pulley arrangement 14, and a voltage regulator 16 controls the alternator field winding excitation during operation of the engine 12 to regulate the voltage on line 20 to a nominal reference voltage such as 27V. The alternator 10 and storage battery 18 are referenced to ground potential 19, and are coupled via line 20 and the over-voltage protection circuit (OVPC) 22 of this invention to output line 34. The electrical loads 36 are coupled to output line 34 via ignition switch 32 as mentioned above, and a gate voltage power supply (GVPS) 24 is coupled to input line 20 as shown. As explained below, GVPS 24 develops an elevated gate drive voltage for OVPC 22 on line 28 when activated by closure of a vehicle activity indicator switch 30 (such as a door switch or the like).

As mentioned above, voltages significantly in excess of the normal output voltage of alternator 10 can be produced on line 20 during jump-starting and during alternator load dump events. In heavy-duty environments, typical jump-start voltages may be as high as 80V, particularly in cases where the jump-voltage is obtained from an engine-driven welding generator. Load dump events occur during engine operation when the storage battery 18 becomes disconnected from line 20 due to a loose battery cable or an intermittent internal battery connection, for example. In this case, the alternator output voltage on line 20 can rise well above the nominal reference voltage before voltage regulator 16 can scale back the alternator field winding excitation. If the excessive voltage in either situation were passed on to line 34, the electrical loads 36 could easily be damaged unless they were individually protected from over-voltage (which is typically cost-prohibitive). Thus, the primary function of OVPC 22 is to limit the output voltage on line 34 to a voltage that will not damage the loads 36. However, since OVPC 22 achieves this function with series-pass suppression devices connected between input line 20 and output line 34, it is also critical that the series on-resistance of OVPC 22 be as small as possible during normal operation when supplying power to the high current electrical loads 36.

Figure 3A:
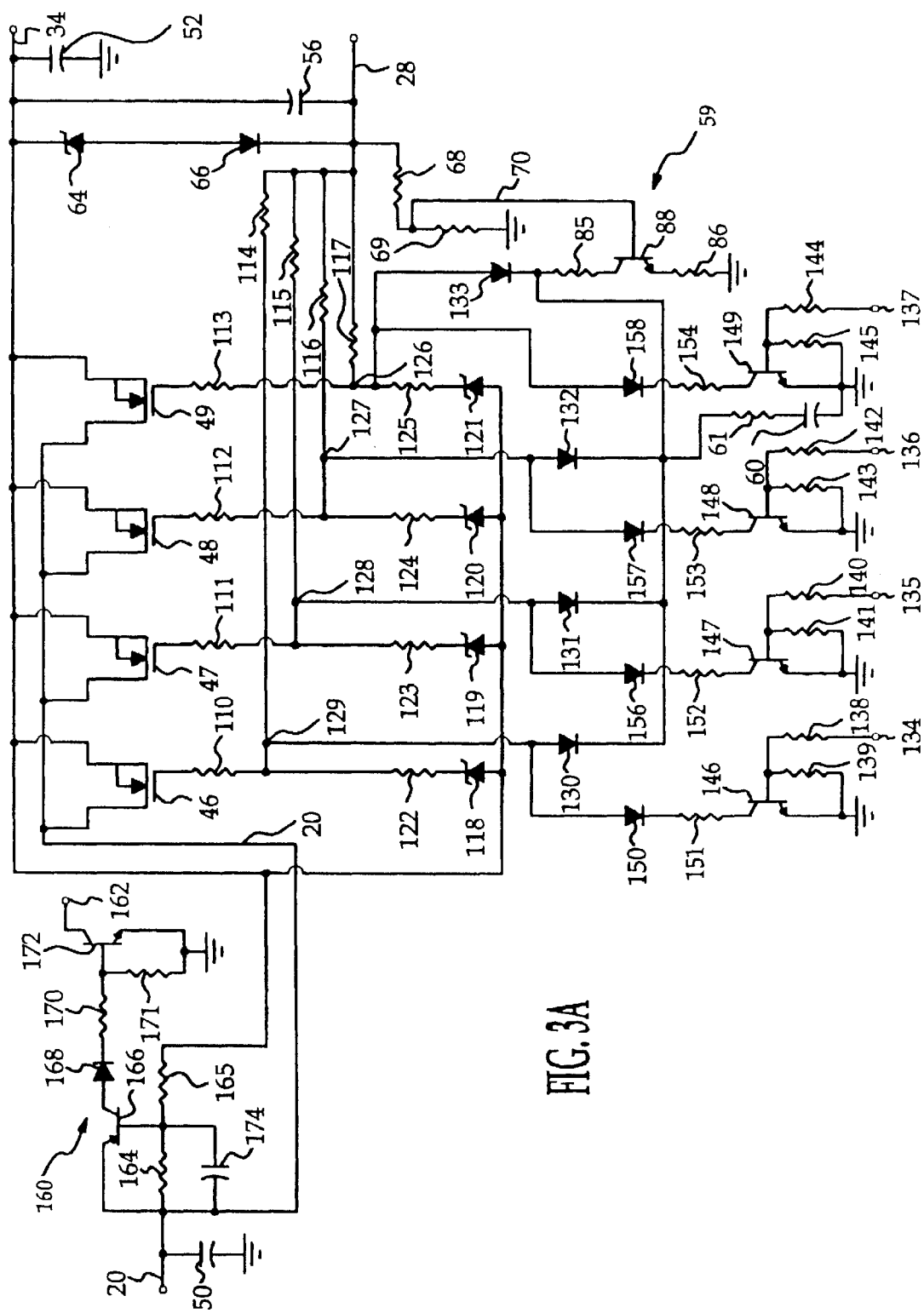
FIGS. 3A and 3B illustrate the series-pass over-voltage protection circuit of FIG. 1.

Referring to FIG. 3A, the above-described functionality of OVPC 22 is carried out in the illustrated embodiment with a set of four parallel-connected N-channel MOSFETs (NFETs) 46, 47, 48, 49, each having its drain terminal connected to input line 20 and its source terminal connected to output line 34. Input capacitive filtering is provided by the capacitor 50, and output capacitive filtering is provided by the capacitor 52. The gate terminals of NFETs 46, 47, 48, 49 are connected via respective gate resistors 110, 111, 112, 113 and input resistors 114, 115, 116, 117 to the output line 28 of GVPS 24, and in the illustrated embodiment, GVPS 24 is activated during normal operation to bias NFETs 46–49 to the fully enhanced state whenever the vehicle activity indicator switch 30 is closed. The capacitor 56 filters the DC output voltage of GVPS 24 on line 28, and the input resistors 114, 115, 116, 117 provide a source impedance that cooperates with an over-voltage regulation circuit 59 to regulate the conduction of the enabled NFETs 46–49 during over-voltage conditions, as explained below. The zener diodes 118, 119, 120, 121 provide gate over-voltage protection for the NFETs 46, 47, 48, 49, respectively, and the resistors 122, 123, 124, 125 limit the current supplied to over-voltage regulation circuit 59 through the respective zener diodes 118, 119, 120, 121 during over-voltage suppression. Finally, the serially connected capacitor 60 and resistor 61 define a compensation network to facilitate fast transition of the NFETs 46–49 from the fully enhanced mode to the controlled conduction or linear mode and to enhance the stability of over-voltage regulation circuit 59.

The over-voltage regulation circuit 59 includes a pair of resistors 68 and 69 coupled in series with Zener diode 64 and reverse voltage protection diode 66 between output line 34 and ground 19, so that a control voltage is developed on line 70 whenever the output voltage exceeds the breakdown voltage of Zener diode 64 (which may be 30V, for example). The voltage on line 70 is applied to the base of a high-current-capability gate discharge transistor 88, and the emitter-collector circuit of transistor 88 couples the junctions 126, 127, 128, 129 between gate resistors 110, 111, 112, 113 and input resistors 114, 115, 116, 117 to ground 19 through isolation diodes 130, 131, 132, 133 and resistors 85 and 86. Thus, the over-voltage regulation circuit 59 sinks NFET gate charge in relation to the degree to which the output voltage on line 34 exceeds the breakdown voltage of Zener diode 64 and the forward voltage drop of diode 66.

As discussed above, a problem that arises with parallel-connected series-pass transistors such as the NFETs 46–49 is that during transient suppression, the over-voltage energy will not be evenly dissipated among the several NFETs 46–49 due to parameter tolerances, causing one of the NFETs 46–49 to become hotter than the others. While such imbalances tend to even out during normal low impedance operation, they can become greatly exaggerated during linear (controlled suppression) operation since the gate threshold voltage of an NFET tends to decrease with increasing transistor temperature. As a result, the hottest NFET 46–49 tends to turn on even harder, leading to a condition commonly referred to as power-hogging. A corresponding effect occurs in bipolar transistors, where increases in temperature cause the base-emitter voltage threshold to decrease and the transistor gain to increase. While the imbalance may be mitigated to some extent by utilizing a negative feedback element such as a source resistor that reduces the conduction of the NFET(s) bearing an inordinate share of the power dissipation, the added resistance causes a handicap during normal low impedance operation when the on-resistance has to be minimized.

The above-described problem is addressed according to the present invention, by logic circuitry that cycles the conduction periods of NFETs 46–49 during over-voltage suppression. During normal operation, on the other hand, all of the NFETs 46–49 are biased to the fully conductive/enhanced state to provide very low pass-through on-resistance. However, during linear (over-voltage suppression) operation, all but a selected one of the NFETs 46–49 is disabled, and the selected NFET is indexed so that individual NFETs 46–49 are enabled in sequence with a small amount of conduction overlap between successively enabled NFETs. Sequentially enabling the NFETs 46–49 guarantees at least a minimum level of load sharing, and the overlap minimizes switching-related output current transients.

Figure 2:
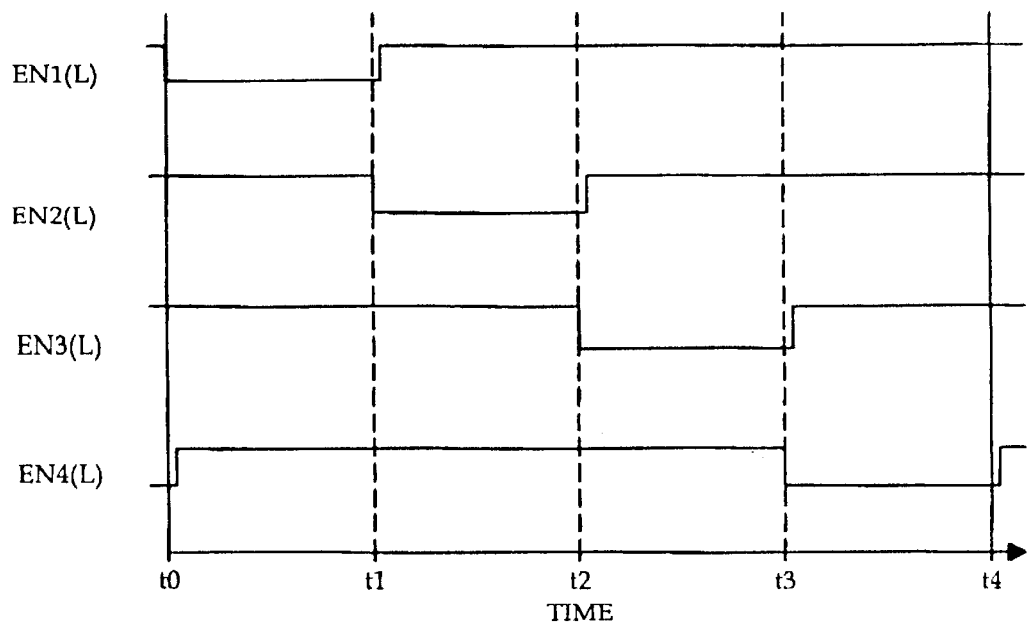
FIG. 2 is a timing diagram illustrating a control for sequentially enabling a set of four series pass transistors in the over-voltage protection circuit of FIG. 1.

The timing diagram of FIG. 2 illustrates the cycle control, where EN1(L), EN2(L), EN3(L) and EN4(L) designate logic-level enable signals for enabling or disabling the respective NFETs 46, 47, 48, 49. The parenthetical L indicates that the respective NFET is enabled when the logic level of the enable signal is Low. The enable signals are developed by the logic circuit 200 depicted in FIG. 3B, and applied to the input terminals 134, 135, 136, 137 of the NFET control circuit of FIG. 3A. Referring to FIG. 3A, each enable signal is applied to a pair of divider resistors 138, 139; 140, 141; 142, 143; 144, 145, and to the base of a respective switching transistor 146, 147, 148, 149. When EN1(L) is high (logic level one), the transistor 146 couples the junction 129 to ground through reverse voltage protection diode 150 and resistor 151, which effectively biases NFET 46 to a nonconductive state. When EN1(L) is low (logic level zero), the transistor 146 is biased off, and NFET 46 controlled by GVPS 24 and over-voltage regulation circuit 59 as explained above. The other enable signals EN2(L), EN3(L), EN4(L) have a corresponding effect on NFETs 47, 48, 49, via resistors 152, 153, 154 and reverse voltage protection diodes 156, 157, 158, respectively. During normal operation, the enable signals EN1(L), EN2(L), EN3(L), EN4(L) are maintained at a logic level zero so that the NFETs 46–49 are all biased to the fully enhanced state by GVPS 24 as explained above.

Figure 3B:
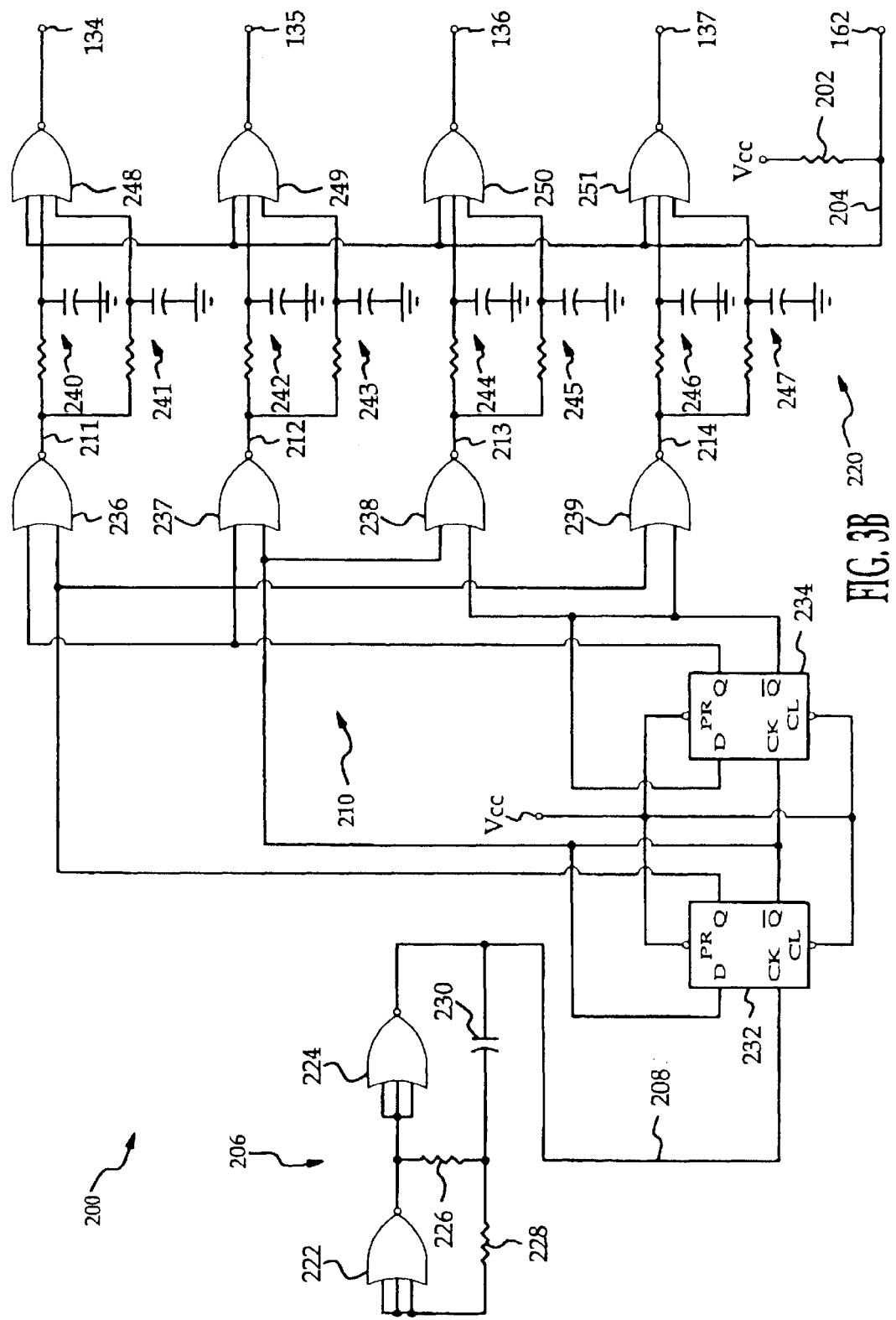

The clamp detection circuit 160 of FIG. 3A detects when at least one of the NFETs 46–49 is being operated in the linear (over-voltage suppression) mode, and provides a clamp signal output for logic circuit 200 at output node 162. A pair of divider resistors 164, 165 couple the input line 20 to output line 34, and the junction between resistors 164 and 165 is coupled to the base of PNP transistor 166. The emitter of transistor 166 is coupled to input line 20, and its collector is coupled via reverse voltage protection diode 168 to an output amplifier comprising the resistors 170, 171 and NPN transistor 172. In normal operation, NFETs 46–49 are fully enhanced so that the voltage potential between input line 20 and output line 34 is very small; in this case, the transistors 166 and 172 are both biased off, presenting a high impedance between output node 162 and ground potential. During over-voltage suppression, however, the voltage drop across one or more of the NFETs 46–49 is relatively high; this biases both transistors 166 and 172 on, effectively pulling output node 162 down to ground potential. The capacitor 174 provides low-pass filtering for enhancing stability at the switching point of transistor 166. As seen in FIG. 3B, the logic circuit 200 includes a pull-up resistor 202 coupled to output node 162 for maintaining clamp detect line 204 high (logic level one) when transistors 166 and 172 are non-conductive. Thus, the clamp detect line 204 is high (logic level one) when the NFETs 46–49 are fully enhanced during normal operation, and low (logic level zero) when at least one of the NFETs 46–49 is operating in the linear mode to suppress a detected over-voltage.

Referring to FIG. 3B, the logic circuit 200 generates the enable signals EN1(L), EN2(L), EN3(L) and EN4(L) at terminals 134, 135, 136 and 137, respectively, whenever the signal on clamp detect line 204 is low, indicating that OVPC 22 is operating in the over-voltage suppression mode. The logic circuit 200 includes a clock pulse generator 206 for producing a logic level clock pulse on line 208, a signal generating circuit 210 for producing a set of raw logic-level enable signals on lines 211, 212, 213, 214, and an output circuit 220 for producing the enable signals EN1(L), EN2(L), EN3(L) and EN4(L) at terminals 134, 135, 136 and 137, respectively. The clock pulse generator 206 is a conventional RC timing circuit, including the NOR-gates 222, 224, the resistors 226, 228 and the capacitor 230. The signal generating circuit includes a pair of cascaded D-type flip-flops 232, 234 coupled to the clock pulse on line 208, and a set of NOR-gates 236, 237, 238, 239 coupled to the Q and Q-Bar outputs of flip-flops 232, 234 for producing raw enable signals on lines 211–214 that are essentially the inverse of the enable signals depicted in FIG. 2, but with no overlap. The output circuit 220 includes a pair of RC filters 240, 241; 242, 243; 244, 245; 246, 247 for each of the raw enable signals on lines 211–214, and a set of NOR-gates 248–251 responsive to the filtered raw enable signals and the clamp detect signal on line 204. In each case, one of the RC filters 240, 242, 244, 246 has a relatively short time constant (such as 10 microsec) for removing decoding glitches in the raw enable signals, and the other RC filter 241, 243, 245, 247 has a relatively long time constant (such as 1 msec) for introducing a switching delay that corresponds to the desired amount of NFET conduction overlap during over-voltage suppression. Thus, the enable signal outputs EN1(L), EN2(L), EN3(L) and EN4(L) at terminals 134, 135, 136 and 137 are all low during normal operation of the vehicle electrical system, and cycle high sequentially (with overlap) when a low clamp detect signal on line 204 indicates that the over-voltage suppression mode is active.

The operation of OVPC 22 will now be described in the context of both normal and over-voltage conditions. During periods of vehicle activity (signaled in the illustrated embodiment by closure of vehicle activity indicator switch 30), GVPS 24 produces a boosted gate drive voltage on line 28. This biases NFETs 46–49 to a fully enhanced state through input resistors 114–117 and gate resistors 110–113, providing a high current capability, low on-resistance, path through which alternator 10 and/or battery 18 can supply current to electrical loads 36. During such time, the clamp detect signal on line 204 remains high because the NFETs 46–49 are either non-conductive or fully enhanced, and the enable signals EN1(L), EN2(L), EN3(L), EN4(L) remain low and have no effect on the NFETs 46–49. If an over-voltage on line 34 occurs during this condition (due to jump-starting or load-dump, for example), the transistor 88 is biased into conduction, biasing NFETs 46–49 into a limited conduction (i.e., linear) mode to limit the voltage seen by the loads 36 on line 34 to a value (such as 34V, for example) determined by the over-voltage regulation circuit 59. At such time, the transistors 166 and 172 of clamp detect circuit 160 become conductive, the clamp detect signal on line 204 of logic circuit 200 is pulled low, and the logic circuit 200 produces sequentially cycled enable signals EN1(L), EN2(L), EN3(L), EN4(L) at terminals 134–137 to sequentially cycle the NFET conduction periods as depicted in FIG. 2. The conduction intervals are designed to be long relative to the time required for the over-voltage regulation circuit 59 to adjust for differences in gate threshold voltage, but short relative to the thermal time constant of the NFETs 46–49 and their heat rejection structures. When the over-voltage condition is terminated, transistor 88 returns to a non-conductive state, and GVPS 24 returns the enabled NFET (or NFETs, in the case of overlap) to the fully enhanced state. This biases transistors 166 and 172 of the clamp detect circuit 160 off, and the clamp detect signal on line 204 is pulled high by resistor 202 to maintain the enable signals EN1(L), EN2(L), EN3(L) and EN4(L) low. At such point, all of the NFETs 46–49 are biased to the fully enhanced state by GVPS 24.

In summary, the over-voltage protection apparatus of the present invention provides a simple and effective expedient for protecting electrical load devices from damage due to over-voltage, and addresses the problem of ensuring acceptable load sharing among the NFETs 46–49 during linear (controlled suppression) operation, while retaining minimum on-resistance during normal operation. While described in reference to the illustrated embodiment, it is expected that various modifications in addition to those mentioned above will occur to persons skilled in the art. For example, the logic circuit 200 could be implemented differently than shown in FIG. 3B, the overlap between sequentially enabled NFETs could be omitted, power bipolar transistors may be used in place of the NFETs 46–49, a different number of power transistors could be used, the OVPC 22 could be used in applications other than a motor vehicle electrical system, and so on. Accordingly, it should be understood that over-voltage protection circuits incorporating such modifications may fall within the scope of this invention, which is defined by the appended claims.

What is claimed is:

1. A series-pass over-voltage protection circuit for supplying operating voltage to a high current electrical load from a DC voltage supply that is subject to transient over-voltage, comprising:

a set of parallel-connected transistors coupling said voltage supply to said electrical load;

drive control circuitry effective in a normal mode to bias said transistors to a fully conductive state, and in an over-voltage mode to reduce the conduction of said transistors and regulate said operating voltage to a value that will not damage said electrical load; and load sharing means effective during said over-voltage mode for overriding said drive control circuitry by disabling all but a selected one of said transistors, and sequentially indexing the selected transistor so that said transistors are individually enabled in sequence to ensure load sharing among said transistors.

2. The over-voltage protection circuit of claim 1, wherein said load sharing means comprises:

detection circuitry for detecting an activation of said over-voltage mode based on a voltage potential across said transistors; and a logic circuit for individually enabling said transistors in sequence so long as said over-voltage mode is detected to ensure load sharing among said transistors.

3. The over-voltage protection circuit of claim 1, wherein said load sharing means overlaps the enabling of said transistors during said over-voltage mode so that the selected transistor is enabled before a previously selected transistor is disabled.

4. The over-voltage protection circuit of claim 1, wherein:

said transistors are N-channel MOSFETs (NFETs);

said drive control circuitry develops a gate drive voltage for biasing each of said NFETs to a fully enhanced state in said normal mode, and to a linear state in said over-voltage mode; and said load sharing means removes gate drive voltages from all but the selected NFET during said over-voltage mode.

5. A series-pass over-voltage protection circuit for supplying operating voltage to a high current electrical load from a DC voltage supply that is subject to transient over-voltage, comprising:

a set of parallel-connected transistors coupling said voltage supply to said electrical load; and drive control means effective in a normal mode for biasing each of said transistors to a fully conductive state to establish a low impedance coupling between said voltage supply and said electrical load, and in an over-voltage mode to disable all but a selected one of said transistors, and for reducing the conduction of the selected transistor for regulating said operating voltage to a value that will not damage said electrical load and sequentially indexing the selected transistor so that said transistors are individually enabled in sequence to ensure load sharing among said transistors during said over-voltage mode.

6. The over-voltage protection circuit of claim 5, wherein said drive control means overlaps the enabling of said transistors during said over-voltage mode so that the selected transistor is enabled along with a previously selected transistor during a predetermined overlap interval.

7. A series-pass over-voltage protection circuit for supplying operating voltage to a high current electrical load from a DC voltage supply that is subject to transient over-voltage, comprising:

a set of parallel-connected transistors coupling said voltage supply to said electrical load;

drive control circuitry effective in a normal mode to develop control voltages for biasing said transistors to a fully conductive state, and in an over-voltage mode to adjust said control voltages for reducing the conduction of said transistors and regulating said operating voltage to a value that will not damage said electrical load; and load sharing means effective during said over-voltage mode for removing the control voltages from all but a selected transistor, and sequentially indexing the selected transistor so that said transistors are individually enabled in sequence to ensure load sharing among said transistors.

8. The over-voltage protection circuit of claim 7, wherein said load sharing means comprises:

detection circuitry for detecting an activation of said over-voltage mode based on a voltage potential across said transistors; and a logic circuit for individually enabling said transistors in sequence so long as said over-voltage mode is detected to ensure load sharing among said transistors.

9. The over-voltage protection circuit of claim 7, wherein said load sharing means overlaps the enabling of said transistors during said over-voltage mode so that the selected transistor is enabled along with a previously selected transistor during a predetermined overlap interval.

10. The over-voltage protection circuit of claim 7, wherein:

said transistors are N-channel MOSFETs (NFETs);

said drive control circuitry develops a gate drive voltage for biasing each of said NFETs to a fully enhanced state in said normal mode, and to a linear state in said over-voltage mode; and said load sharing means removes gate drive voltages from all but the selected NFET during said over-voltage mode.

* * * * *